(12) United States Patent
Kai et al.

(10) Patent No.: US 8,803,221 B2
(45) Date of Patent: Aug. 12, 2014

(54) NONVOLATILE SEMICONDUCTOR MEMORY DEVICE AND METHOD OF FABRICATING THE SAME

(75) Inventors: Tetsuya Kai, Kanagawa-ken (JP); Yoshio Ozawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 55 days.

(21) Appl. No.: 13/231,776

(22) Filed: Sep. 13, 2011

(65) Prior Publication Data

US 2012/0086069 A1    Apr. 12, 2012

(30) Foreign Application Priority Data

Sep. 13, 2010   (JP) ................................. 2010-204804

(51) Int. Cl.
*H01L 29/792*   (2006.01)

(52) U.S. Cl.
USPC ............ 257/324; 257/E29.309; 257/E21.546; 438/424

(58) Field of Classification Search
USPC ........................................................ 257/324
See application file for complete search history.

(56) References Cited

U.S. PATENT DOCUMENTS

| | | | |
|---|---|---|---|
| 7,635,890 B2 | 12/2009 | Ozawa et al. | |
| 2005/0062100 A1* | 3/2005 | Wu et al. ...................... | 257/324 |
| 2010/0052039 A1* | 3/2010 | Matsushita et al. ........... | 257/324 |
| 2010/0072539 A1 | 3/2010 | Yasuda | |
| 2010/0203704 A1* | 8/2010 | Inumiya et al. ............... | 438/424 |

OTHER PUBLICATIONS

He et al., "SONOS type memory cell with ALD LaAlO blocking oxide for high speed operation," Solid-State and Integrated-Circuit Technology, 2008. ICSICT 2008. 9th International Conference on, vol., no., pp. 835,838, Oct. 20-23, 2008; doi: 10.1109/ICSICT.2008.4734672.*

Li et al "Studies of the interfacial structure of LaAlO3 thin films on silicon by x-ray reflectivity and angle-resolved x-ray photoelectron spectroscopy," J. Appl. Phys. 97, 124104 (2005); http://dx.doi.org/10.1063/1.1941470 (4 pages).*

Xiong et al., "Defect states in the high-dielectric-constant gate oxide LaAlO3," Appl. Phys. Lett. 89, 022907 (2006); doi: 10.1063/1.2221521.*

* cited by examiner

*Primary Examiner* — Eva Yan Montalvo
*Assistant Examiner* — Christopher Johnson
(74) *Attorney, Agent, or Firm* — Knobbe Martens Olson & Bear LLP

(57) ABSTRACT

In one embodiment, a nonvolatile semiconductor memory device includes a substrate; a tunnel insulating film on the substrate; a charge storage layer on the tunnel insulating film; a block insulating film on the charge storage layer; a first element isolation insulating film in an element isolation trench in the substrate, having a bottom surface lower than an interface between the substrate and the tunnel insulating film, and having a top surface lower than an interface between the charge storage layer and the block insulating film; a second element isolation insulating film on the first element isolation insulating film, protruding to a top surface of the block insulating film, in contact with a side surface of the block insulating film, and having a higher Si concentration than the block insulating film; and a control gate electrode on the block insulating film and on the second element isolation insulating film.

16 Claims, 4 Drawing Sheets

NONVOLATILE SEMICONDUCTOR MEMORY DEVICE AND METHOD OF FABRICATING THE SAME

CROSS REFERENCE TO RELATED APPLICATION

This application is based upon and claims the benefit of priority from prior Japanese Patent Application No. 2010-204804, filed on Sep. 13, 2010, the entire contents of which are incorporated herein by reference.

FIELD

Embodiments described herein relate to a nonvolatile semiconductor memory device and a method for manufacturing the same.

BACKGROUND

Cells in a MONOS (metal-oxide-nitride-oxide-silicon) type nonvolatile semiconductor memory device have recently been becoming finer. With finer cells, an leakage of charges from a charge storage layer is more likely to occur, thus rendering it difficult to ensure a voltage applied to a tunnel insulating film. Thus, a block insulating film made of a high-dielectric-constant material is used on the charge storage layer.

However, lanthanum aluminate, which has heretofore been used for the block insulating film, involves many defects because of having deliquescence. Therefore, the leakage of charges from the charge storage layer to an adjacent cell occurs, thus causing the problem of degradation in charge holding characteristics.

DETAILED DESCRIPTION OF THE INVENTION

A nonvolatile semiconductor memory device according to one embodiment includes a semiconductor substrate. A tunnel insulating film is provided on the semiconductor substrate. A charge storage layer is provided on the tunnel insulating film. A block insulating film is provided on the charge storage layer. A first element isolation insulating film is provided, which is filled into an element isolation trench portion provided in the semiconductor substrate. The first element isolation insulating film has a bottom surface lower in level than an interface where the semiconductor substrate and the tunnel insulating film are in contact with each other, and has a top surface lower in level than an interface where the charge storage layer and the block insulating film are in contact with each other. A second element isolation insulating film is provided, which is formed on the first element isolation insulating film. The second element isolation insulating film protrudes to a top surface of the block insulating film while being in contact with a side surface of the block insulating film. The second element isolation insulating film has a Si concentration higher than the block insulating film. A control gate electrode is provided on the block insulating film and on the second element isolation insulating film.

Embodiments of the present invention will be described below with reference to the drawings.

First Embodiment

Figure 1A:
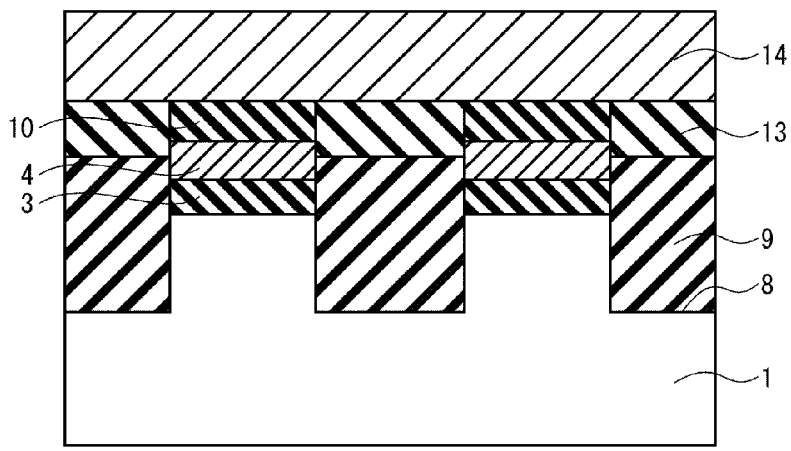
FIG. 1A is a cross-sectional view showing a fundamental structure of a nonvolatile semiconductor memory device, parallel to a word line direction.
Figure 1B:
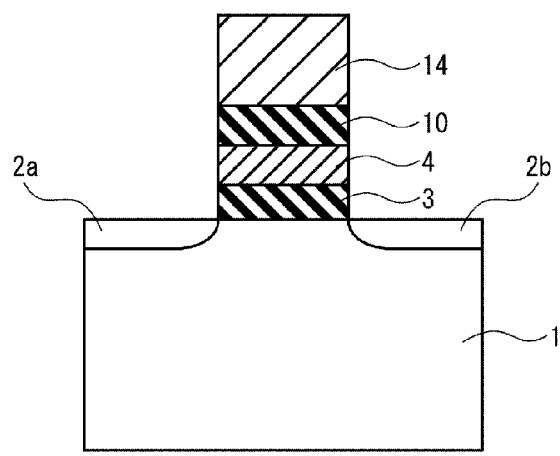
FIG. 1B is a cross-sectional view showing the fundamental structure of the nonvolatile semiconductor memory device, parallel to a bit line direction.

FIG. 1A shows a cross-sectional view of a nonvolatile semiconductor memory device according to the first embodiment, parallel to a word line direction, and FIG. 1B shows a cross-sectional view of the nonvolatile semiconductor memory device according to the first embodiment, parallel to a bit line direction.

A source region $2a$ and a drain region $2b$ are formed in a semiconductor substrate 1 at ends, respectively, of a laminated structure made up of a tunnel insulating film 3, a charge storage layer 4, a block insulating film 10 and a control gate electrode 14, above the semiconductor substrate 1.

The tunnel insulating film 3 is provided on the semiconductor substrate 1 at an intersection of a bit line and a word line. A silicon oxide film is used for the tunnel insulating film 3; however, a silicon nitride film or a silicon oxynitride film may be used. Besides, a multilayer structure of the silicon oxide film and the silicon nitride film may be used for the tunnel insulating film 3. The tunnel insulating film 3 has a film thickness on the order of 3 nm to 9 nm.

The charge storage layer 4 is provided on the tunnel insulating film 3 and is in contact with a side surface of a second element isolation insulating film 13. A silicon nitride film having a film thickness on the order of 5 nm to 10 nm, for example, is used for the charge storage layer 4.

The block insulating film 10 is provided on the charge storage layer 4 and is in contact with the side surface of the second element isolation insulating film 13. $La_xAl_yO_z$ is used for the block insulating film 10. Desirably, the value of z is between 1.5 and 3.0 inclusive ($1.5 \leq z \leq 3.0$). This value is within the range of values which z may take on under stoichiometry conditions. Incidentally, the value of z may lie outside the above-described range. The block insulating film 10 has a film thickness on the order of, for example, 5 nm to 30 nm.

A first element isolation insulating film 9 is filled into an element isolation trench portion 8 provided in the semiconductor substrate 1. A top surface of the first element isolation insulating film 9 is in contact with a bottom surface of the second element isolation insulating film 13. The level of a bottom surface of the first element isolation insulating film 9 is lower than the level of an interface where the semiconductor substrate 1 and the tunnel insulating film 3 are in contact with each other. The level of the top surface of the first element isolation insulating film 9 is lower than that of a bottom surface of the charge storage layer 4. A silicon oxide film, for example, is used for the first element isolation insulating film 9.

The second element isolation insulating film 13 is provided on the first element isolation insulating film 9 and is in contact with side surfaces of the charge storage layer 4 and the block insulating film 10. The level of the bottom surface of the second element isolation insulating film 13 is lower than that of a top surface of the charge storage layer 4. $La_xAl_ySi_zO_w$ is used for the second element isolation insulating film 13. $La_xAl_ySi_zO_w$ has fewer defects than $La_xAl_yO_z$. Desirably, the value of w is between 1.5 and 5.0 inclusive ($1.5 \leq w \leq 5.0$). This value is within the range of values which w may take on under stoichiometry conditions. Incidentally, the value of w may lie outside the above-described range.

Incidentally, it is desirable that the above-described block insulating film 10 be constructed of any one of an oxide, a nitride and an oxynitride containing an element selected from among La, Al, Hf, Y, Ce, Ti, Ta, Sc, Dy and Zr, and having a higher dielectric constant than a silicon nitride film. For example, HfAlO, ZrAlO, HfAlON or the like may be used for the block insulating film 10.

Also, it is desirable that the second element isolation insulating film 13 be constructed of any one of an oxide, a nitride and an oxynitride containing the element contained in the block insulating film 10 and Si, and having a higher dielectric constant than the silicon nitride film. For example, HfAlSiO, ZrAlSiO, HfAlSiON or the like may be used for the second element isolation insulating film 13.

The control gate electrode 14 is provided on the block insulating film 10 and on the second element isolation insulating film 13. A metal film, a polycrystalline silicon film or a silicide film, for example, is used for the control gate electrode 14.

According to the nonvolatile semiconductor memory device according to the first embodiment, $La_xAl_ySi_zO_w$ containing a Si element is used for the second element isolation insulating film 13. This enables reducing defects in the insulating films between cells.

A method for manufacturing the nonvolatile semiconductor memory device according to the first embodiment will be described below.

FIGS. 2A to 2K are cross-sectional views, parallel to the word line direction, showing the method for manufacturing the nonvolatile semiconductor memory device according to the first embodiment.

Figure 2A:
FIGS. 2A to 2K are cross-sectional views showing a method for manufacturing a nonvolatile semiconductor memory device according to a first embodiment.

As shown in FIG. 2A, a silicon oxide film is formed as the tunnel insulating film 3 by subjecting the top of the semiconductor substrate 1 to thermal oxidation at 600° C. to 1000° C. in a dry oxygen atmosphere or in an atmosphere of steam. CVD (Chemical Vapor Deposition) method or ALD (Atomic Layer Deposition) method may be used to form the silicon oxide film.

Figure 2B:

Then, as shown in FIG. 2B, a silicon nitride film is formed as the charge storage layer 4 on the tunnel insulating film 3 by CVD method. Formation of the above-described silicon nitride film is accomplished by introducing dichlorosilane ($SiH_2Cl_2$) and ammonia ($NH_3$) into a reactor heated to 600° C. to 800° C., and maintaining the reactor at a pressure of 0.1 Torr to 1 Torr. Incidentally, ALD method or MBE (Molecular Beam Epitaxy) method may be used to form the silicon nitride film.

Then, a silicon oxide film 5 is formed on the charge storage layer 4 by CVD method. As an example, a preferred method involves introducing dichlorosilane ($SiH_2Cl_2$) and nitrous oxide ($N_2O$) into the reactor heated to 600° C. to 800° C., and maintaining the reactor at a pressure of 0.1 Torr to 5 Torr, thereby obtaining the silicon oxide film 5.

Figure 2C:

Then, as shown in FIG. 2C, a silicon nitride film 6 is formed on the silicon oxide film 5 by CVD method. As an example, a preferred method involves introducing dichlorosilane ($SiH_2Cl_2$) and ammonia ($NH_3$) into a reactor heated to 600° C. to 800° C., and maintaining the pressure between 0.1 Torr and 1 Torr, thereby obtaining the silicon nitride film 6.

Figure 2D:
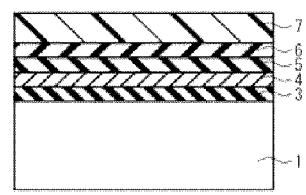
Figure 2E:
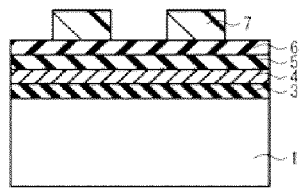

Then, as shown in FIG. 2D, a photoresist film 7 is deposited by coating method, and is patterned by photolithography method in such a manner that the photoresist film 7 remains as shown in FIG. 2E.

Figure 2F:
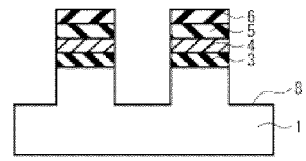

Then, the silicon nitride film 6 and the silicon oxide film 5 are etched by RIE (Reactive Ion Etching) method using the photoresist film 7 as a mask. After that, the photoresist film 7 is removed, and the charge storage layer 4, the tunnel insulating film 3 and the semiconductor substrate 1 are etched by RIE using the silicon nitride film 6 as a mask. Thereby, the surface of the semiconductor substrate 1 is exposed to form the element isolation trench portion 8 as shown in FIG. 2F.

Figure 2G:
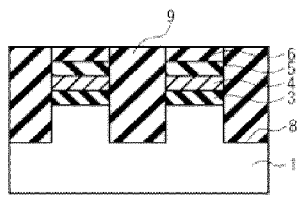

Then, a silicon oxide film is deposited by introducing tetraethoxysilane (TEOS) into a reactor at 600° C. to 750° C., and maintaining the reactor at a pressure on the order of 0.1 Torr to 5 Torr. After that, the surface of the deposited silicon oxide film is flattened by CMP (Chemical Mechanical Polishing) method until the silicon nitride film 6 is exposed, as shown in FIG. 2G. Thereby, the silicon oxide film is filled as the first element isolation insulating film 9 into the element isolation trench portion 8.

Figure 2H:
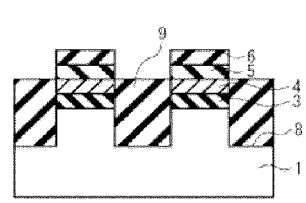

Then, as shown in FIG. 2H, the silicon oxide film as the first element isolation insulating film 9 is selectively etched to the level of the top surface of the charge storage layer 4 by RIE with a selective ratio to the silicon nitride film 6. In this case, the block insulating film 10 to be described later can be grown flat, and the control gate electrode 14 can be grown without voids developing therein. Incidentally, if no voids develop in the control gate electrode 14, the level of the top surface of the first element isolation insulating film 9 after the above-described etching may be different from the level of the top surface of the charge storage layer 4.

Figure 2I:
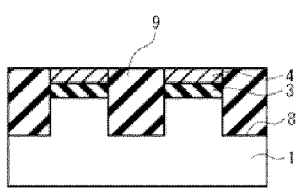

Then, the remaining silicon nitride film 6 is selectively wet etched with a mixed solution of phosphoric acid and water at about 200° C. After that, as shown in FIG. 2I, the silicon oxide film 5 is removed for example by hydrofluoric acid. At this time, the first element isolation insulating film 9 may be etched, depending on etching conditions and a material for the first element isolation insulating film 9.

Figure 2J:
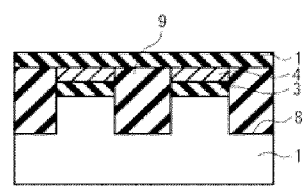

Then, as shown in FIG. 2J, a $La_xAl_yO_z$ film is formed as the block insulating film 10 by CVD method. Using $La(EtCp)_3$ (tris(ethylcyclopentadienyl)lanthanum) as a lanthanum (La) material and using TMA (trimethyl aluminum) as an aluminum (Al) material, formation of the $La_xAl_yO_z$ film is accomplished by introducing ozone ($O_3$) together with the above-described gases into the reactor in which a temperature is between 200° C. and 700° C. and a pressure is between 0.1 Torr and 5 Torr. Besides, sputtering method using an $Al_2O_3$ target and a $La_2O_3$ target or MBE method may be used to obtain the $La_xAl_yO_z$ film.

Figure 2K:
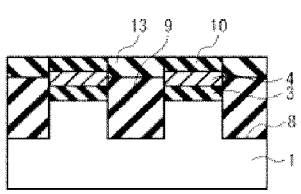

Then, heat treatment is performed in the reactor at 700° C. to 1100° C. in an atmosphere of nitrogen, and thereby an upper portion of the silicon oxide film as the first element isolation insulating film 9 and the block insulating film 10 on the first element isolation insulating film 9 are diffusely mixed, thus forming a $La_xAl_ySi_zO_w$ film as the second element isolation insulating film 13 on the first element isolation insulating film 9, as shown in FIG. 2K.

Then, as shown in FIG. 1A, the control gate electrode 14 is formed on the block insulating film 10 and on the second element isolation insulating film 13. A silicon film doped with phosphorus by introducing monosilane ($SiH_4$) and phosphine ($PH_3$) into the reactor in which the temperature is between 400° C. and 700° C. and the pressure is between 0.1 Torr and 5 Torr, for example, is used for the control gate electrode 14.

Then, RIE is performed in the word line direction to expose the semiconductor substrate 1. After that, the source region 2a and the drain region 2b are formed by ion implantation, and thereby, the nonvolatile semiconductor memory device is formed as shown in FIGS. 1A and 1B.

According to the method for manufacturing the nonvolatile semiconductor memory device according to the first embodiment, the heat treatment is performed, and thereby the upper portion of the silicon oxide film as the first element isolation insulating film 9 and the block insulating film 10 on the first element isolation insulating film 9 are diffusely mixed, thus forming $La_xAl_ySi_zO_w$ as the second element isolation insulating film 13. This eliminates the need for a heat treatment process for making dense the block insulating film 10 and the second element isolation insulating film 13, thus enabling a reduction in manufacturing costs.

As described above, according to the first embodiment of the present invention, $La_xAl_yO_z$ having a higher dielectric constant than the silicon nitride film is used for the block insulating film 10, and $La_xAl_ySi_zO_w$ is provided as the second element isolation insulating film 13 on the silicon oxide film as the first element isolation insulating film 9. In other words, while the high-dielectric-constant film is used for the block insulating film 10, the second element isolation insulating film 13 alone has an increased Si concentration, thus enabling a reduction in the defects in the insulating films between the cells. This enables reducing the proportion of stored charges in the charge storage layer 4, moving to an adjacent cell, and hence enables suppressing degradation in charge holding characteristics.

Second Embodiment

A nonvolatile semiconductor memory device according to the second embodiment of the present invention will be described with reference to FIG. 1A. As for a configuration of the second embodiment, the same parts as those of the configuration of the nonvolatile semiconductor memory device according to the first embodiment shown in FIG. 1A are designated by the same reference numerals, and detailed description thereof will be omitted. The second embodiment is different from the first embodiment in that, rather than using $La_xAl_yO_z$ for the block insulating film 10 shown in FIG. 1A, $La_xAl_ySi_zO_w$ is used for the block insulating film 10, and the second element isolation insulating film 13 has a higher Si concentration than the block insulating film 10. Incidentally, it is desirable that the block insulating film 10 and the second element isolation insulating film 13 be constructed of any one of an oxide, a nitride and an oxynitride containing an element selected from among La, Al, Hf, Y, Ce, Ti, Ta, Sc, Dy and Zr, and also containing Si, and having a higher dielectric constant than a silicon nitride film. For example, HfAlSiO, ZrAlSiO, HfAlSiON or the like may be used for the block insulating film 10 and the second element isolation insulating film 13.

According to the nonvolatile semiconductor memory device according to the second embodiment, $La_xAl_ySi_zO_w$ containing the Si element is used for the block insulating film 10. This enables improving heat resistance of the block insulating film 10. Also, $La_xAl_ySi_zO_w$ containing the Si element is used for the second element isolation insulating film 13. Also, the second element isolation insulating film 13 has a high Si concentration, thus enabling the reduction in the defects in the insulating films between the cells.

Figure 3A:
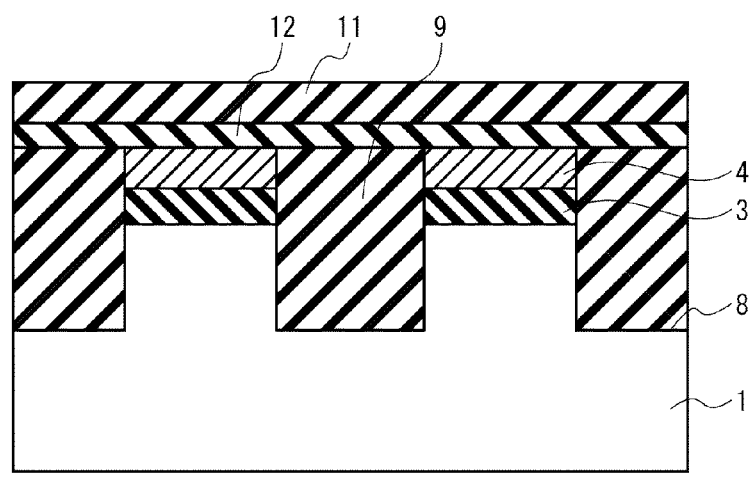
FIGS. 3A and 3B are cross-sectional views showing a method for manufacturing a nonvolatile semiconductor memory device according to a second embodiment.
Figure 3B:
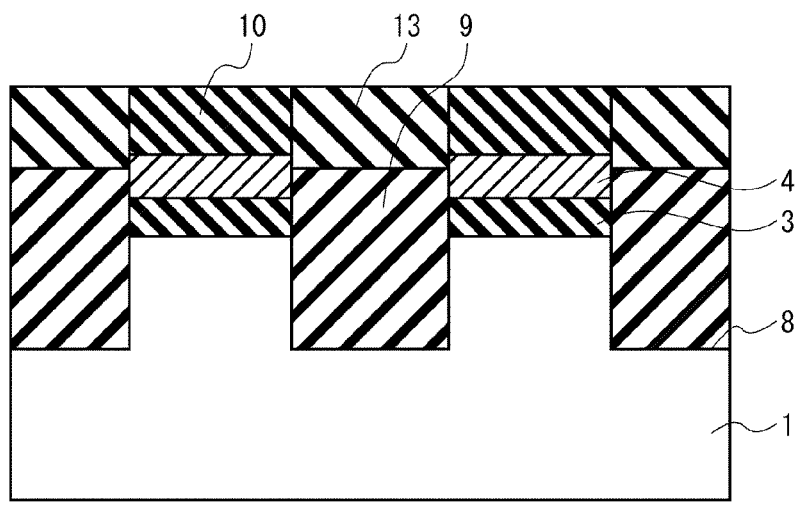

A method for manufacturing the nonvolatile semiconductor memory device according to the second embodiment of the present invention will be described with reference to the drawings. FIGS. 3A and 3B are cross-sectional views, parallel to the word line direction, showing the method for manufacturing the nonvolatile semiconductor memory device according to the second embodiment.

In the same manner as the first embodiment, as shown in FIGS. 2A to 2I, the tunnel insulating film 3 and the charge storage layer 4 are formed on the semiconductor substrate 1, and the silicon oxide film is filled as the first element isolation insulating film 9 into the element isolation trench portion 8.

Then, a silicon oxide film is formed as a second insulating film 12 on the charge storage layer 4 and on the first element isolation insulating film 9 by CVD method. As an example, a preferred method involves introducing dichlorosilane ($SiH_2Cl_2$) and nitrous oxide ($N_2O$) into the reactor heated to 600° C. to 800° C., and maintaining the reactor at a pressure of 0.1 Torr to 5 Torr, thereby obtaining the silicon oxide film. After that, as shown in FIG. 3A, a $La_xAl_yO_z$ film is formed as a first insulating film 11 by CVD method. It is desirable that the first insulating film 11 be constructed of any one of an oxide, a nitride and an oxynitride containing an element selected from among La, Al, Hf, Y, Ce, Ti, Ta, Sc, Dy and Zr, and having a higher dielectric constant than a silicon nitride film.

Then, heat treatment is performed in the reactor at 700° C. to 1100° C. in an atmosphere of nitrogen. Thereby, as shown in FIG. 3B, in an upper portion of the cell, $La_xAl_yO_z$ as the first insulating film 11 and the silicon oxide film as the second insulating film 12 are diffusely mixed to form a $La_xAl_ySi_zO_w$ film as the block insulating film 10. In an upper portion of the element isolation trench portion 8, the $La_xAl_yO_z$ film as the first insulating film 11, the silicon oxide film as the second insulating film 12, and the upper portion of the silicon oxide film as the first element isolation insulating film 9 are diffusely mixed to form a $La_xAl_ySi_zO_w$ film as the second element isolation insulating film 13. At this time, in the upper portion of the element isolation trench portion 8, the silicon oxide film as the first element isolation insulating film 9 also undergoes the diffused mixing, and thus, the second element isolation insulating film 13 has a higher Si concentration than the block insulating film 10, and also, the level of the bottom surface of the second element isolation insulating film 13 is lower than that of the top surface of the charge storage layer 4.

Then, in the same manner as the first embodiment, the nonvolatile semiconductor memory device is formed as shown in FIGS. 1A and 1B.

Incidentally, it has been mentioned above that, on the charge storage layer 4 and on the first element isolation insulating film 9, the formation of $La_xAl_yO_z$ as the first insulating film 11 takes place after the formation of the silicon oxide film as the second insulating film 12; however, they may take place in reverse order. In other words, on the charge storage layer 4 and on the first element isolation insulating film 9, the formation of the silicon oxide film as the second insulating film 12 may take place after the formation of $La_xAl_yO_z$ as the first insulating film 11.

According to the method for manufacturing the nonvolatile semiconductor memory device according to the second embodiment, the heat treatment is performed thereby to form the $La_xAl_ySi_zO_w$ film as the block insulating film 10 in the upper portion of the cell, and form the $La_xAl_ySi_zO_w$ film as the second element isolation insulating film 13 in the upper portion of the element isolation trench portion 8. This eliminates the need for the heat treatment process for making dense the block insulating film 10 and the second element isolation insulating film 13, thus enabling the reduction in the manufacturing costs.

As described above, according to the second embodiment of the present invention, $La_xAl_ySi_zO_w$ having a higher dielectric constant than the silicon nitride film is used for the block insulating film 10, and $La_xAl_ySi_zO_w$ having a higher Si concentration than the block insulating film 10 is provided as the second element isolation insulating film 13 on the silicon oxide film as the first element isolation insulating film 9. In other words, while the high-dielectric-constant film is used for the block insulating film 10, the second element isolation insulating film 13 has the increased Si concentration, thus enabling an improvement in the heat resistance of the block insulating film 10 and hence the reduction in the defects in the insulating films between the cells. This enables reducing the proportion of stored charges moving to the adjacent cell, and hence enables suppressing the degradation in the charge holding characteristics.

According to at least one of the embodiments described in detail above, while the block layer with a high dielectric constant is used, the second element isolation insulating film 13 has the increased Si concentration, thus enabling the reduction in the defects in the insulating films between the cells. This enables reducing the proportion of stored charges in the charge storage layer 4, moving to the adjacent cell, and hence enables suppressing the degradation in the charge holding characteristics.

Incidentally, in the above-mentioned first and second embodiments, the values of the film thicknesses have been described; however, the values of the film thicknesses may lie outside the above-described ranges.

Incidentally, in the above-mentioned first and second embodiments, the present invention has been described as the nonvolatile semiconductor memory device of MONOS structure; however, it may be applied to a floating gate type nonvolatile semiconductor memory device in which a polysilicon film is used as a floating gate for the charge storage layer 4.

Incidentally, in the above-mentioned first and second embodiments, description has been given assuming that the level of the bottom surface of the second element isolation insulating film 13 is higher than that of the bottom surface of the charge storage layer 4; however, the level of the bottom surface of the second element isolation insulating film 13 may be lower than that of the bottom surface of the charge storage layer 4.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor substrate comprising an element isolation trench;
   a tunnel insulating film on the semiconductor substrate;
   a charge storage layer on the tunnel insulating film;
   a block insulating film on the charge storage layer;
   a first element isolation insulating film in the element isolation trench, the first element isolation insulating film having a bottom surface lower in level than an interface where the semiconductor substrate and the tunnel insulating film are in contact with each other, the first element isolation insulating film having a top surface lower in level than an interface where the charge storage layer and the block insulating film are in contact with each other;
   a second element isolation insulating film on the first element isolation insulating film, the second element isolation insulating film protruding to a top surface of the block insulating film and being in contact with a side surface of the block insulating film, the second element isolation insulating film having a higher Si concentration than the block insulating film; and
   a control gate electrode on the block insulating film and on the second element isolation insulating film.

2. The nonvolatile semiconductor memory device according to claim 1, wherein the block insulating film and the second element isolation insulating film comprise any of an oxide, a nitride, and an oxynitride having a higher dielectric constant than a silicon nitride film.

3. The nonvolatile semiconductor memory device according to claim 1, wherein:
   the block insulating film comprises a first element selected from: La, Al, Hf, Y, Ce, Ti, Ta, Sc, Dy and Zr, and
   the second element isolation insulating film comprises Si and the first element.

4. The nonvolatile semiconductor memory device according to claim 1, wherein:
   the block insulating film comprises a $La_xAl_yO_z$ film, and
   the second element isolation insulating film comprises a $La_xAl_ySi_zO_w$ film.

5. The nonvolatile semiconductor memory device according to claim 4, wherein:
   a value of z in the $La_xAl_yO_z$ film is between 1.5 and 3.0 inclusive ($1.5 \leq z \leq 3.0$), and
   a value of w in the $La_xAl_ySi_zO_w$ film is between 1.5 and 5.0 inclusive ($1.5 \leq w \leq 5.0$).

6. The nonvolatile semiconductor memory device according to claim 1, wherein the block insulating film has a film thickness of 5 nm to 30 nm.

7. The nonvolatile semiconductor memory device according to claim 1, wherein:
   the block insulating film comprises Si and a first element selected from: La, Al, Hf, Y, Ce, Ti, Ta, Sc, Dy and Zr, and
   the second element isolation insulating film comprises Si and the first element, and has a higher Si concentration than the block insulating film.

8. The nonvolatile semiconductor memory device according to claim 1, wherein
   the block insulating film comprises a $La_xAl_ySi_zO_w$ film, and
   the second element isolation insulating film comprises a $La_xAl_ySi_zO_w$ film and has a higher Si concentration than the block insulating film.

9. A method of manufacturing a nonvolatile semiconductor memory device, the method comprising:
   forming a tunnel insulating film on a semiconductor substrate;
   forming a charge storage layer on the tunnel insulating film;
   forming an element isolation trench portion by etching the charge storage layer, the tunnel insulating film, and the semiconductor substrate;
   filling a first element isolation insulating film into the element isolation trench portion, to the level of a top surface of the charge storage layer;
   forming a first insulating film on the charge storage layer and on the first element isolation insulating film;
   forming, by heat treatment, a block insulating film on the charge storage layer, and a second element isolation insulating film on the first element isolation insulating film, the second element isolation insulating film having a higher Si concentration than the block insulating film; and forming a control gate electrode on the block insulating film and on the second element isolation insulating film.

10. The method according to claim 9, wherein:
the first insulating film comprises any of an oxide, a nitride, and an oxynitride having a higher dielectric constant than a silicon nitride film.

11. The method according to claim 9, wherein:
the block insulating film comprises a first element selected from: La, Al, Hf, Y, Ce, Ti, Ta, Sc, Dy and Zr, and
the second element isolation insulating film comprises Si and the first element.

12. The method according to claim 9, wherein:
the block insulating film comprises a $La_xAl_yO_z$ film, and
the second element isolation insulating film comprises a $La_xAl_ySi_zO_w$ film.

13. The method according to claim 12, wherein:
a value of z in the $La_xAl_yO_z$ film is between 1.5 and 3.0 inclusive ($1.5 \leq z \leq 3.0$), and
a value of w in the $La_xAl_ySi_zO_w$ film is between 1.5 and 5.0 inclusive ($1.5 \leq w \leq 5.0$).

14. The method according to claim 9, further comprising forming a second insulating film on one surface of the first insulating film, wherein an upper portion of the first element isolation insulating film, the first insulating film, and the second insulating film are diffusely mixed by the heat treatment forming the block insulating film and the second element isolation insulating film.

15. The method according to claim 14, wherein: the block insulating film comprises Si and a first element selected from: La, Al, Hf, Y, Ce, Ti, Ta, Sc, Dy, Zr, and the second element isolation insulating film comprises Si and the first element, and has a higher Si concentration than the block insulating film.

16. The method according to claim 15, wherein
the block insulating film comprises a $La_xAl_ySi_zO_w$ film, and
the second element isolation insulating film comprises a $La_xAl_ySi_zO_w$ film and has a higher Si concentration than the block insulating film.

* * * * *